United States Patent
Kopp et al.

(10) Patent No.: US 11,309,615 B2
(45) Date of Patent: Apr. 19, 2022

(54) DUAL SLOT COMMON MODE NOISE FILTER

(71) Applicant: HEWLETT PACKARD ENTERPRISE DEVELOPMENT LP, Houston, TX (US)

(72) Inventors: David Kopp, Fort Collins, CO (US); James Stewart, Fort Collins, CO (US); Karl Bois, Fort Collins, CO (US); Elene Chobanyan, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 137 days.

(21) Appl. No.: 16/374,515

(22) Filed: Apr. 3, 2019

(65) Prior Publication Data

US 2020/0321672 A1 Oct. 8, 2020

(51) Int. Cl.
*H01P 1/20* (2006.01)
*H03H 7/42* (2006.01)
*H01P 11/00* (2006.01)
*H01P 3/08* (2006.01)

(52) U.S. Cl.
CPC .............. *H01P 1/20* (2013.01); *H01P 3/08* (2013.01); *H01P 11/003* (2013.01); *H01P 11/007* (2013.01); *H03H 7/427* (2013.01)

(58) Field of Classification Search
CPC .. H03H 7/427; H03H 2001/0085; H01P 1/20; H01P 11/003; H01P 11/007; H01P 3/08
USPC .................................................. 333/181, 185
See application file for complete search history.

(56) References Cited

U.S. PATENT DOCUMENTS

| | | |
|---|---|---|
| 6,765,450 B2 | 7/2004 | Howard et al. |
| 8,552,811 B2 | 10/2013 | Wu et al. |
| 8,624,688 B2 | 1/2014 | Essenwanger |
| 10,178,761 B2 | 1/2019 | Bois et al. |
| 10,499,489 B2 | 12/2019 | Bois et al. |
| 2009/0108369 A1 | 4/2009 | Chu |
| 2015/0083714 A1 | 3/2015 | Turetken et al. |
| 2015/0318834 A1* | 11/2015 | Wu .................. H03H 7/427 333/12 |
| 2017/0064815 A1 | 3/2017 | Hung et al. |

OTHER PUBLICATIONS

Zhuang, W. et al.; "Common-mode Suppression Design for Gigahertz Differential Signals Based on C-Slotline"; 2016; 10 pages.

* cited by examiner

*Primary Examiner* — Rakesh B Patel
(74) *Attorney, Agent, or Firm* — Hewlett Packard Enterprise Patent Department

(57) ABSTRACT

A multiple-layer circuit board has a signaling layer plane, an exterior layer plane, and a ground layer plane. A pair of differential signal lines implemented as strip-lines are within the signaling layer, and propagate electromagnetic interference (EMI) along the signaling layer. A dual slot common mode noise filter may be etched within the ground layer and may include a first U-shaped etching pair comprising a first U-shaped etching and a second U-shaped etching opposing the first U-shaped etching within the ground layer plane.

18 Claims, 9 Drawing Sheets

DUAL SLOT COMMON MODE NOISE FILTER

BACKGROUND

Electronic devices commonly include circuit boards, such as printed circuit boards. The circuit boards have electrical components like integrated circuits (ICs), capacitors, resistors, and so on attached thereto which interact with one another to provide the desired functionality of the electronic devices. Signal lines are employed on or within the circuit boards to communicatively connect these electrical components.

DETAILED DESCRIPTION

Figure 1A:
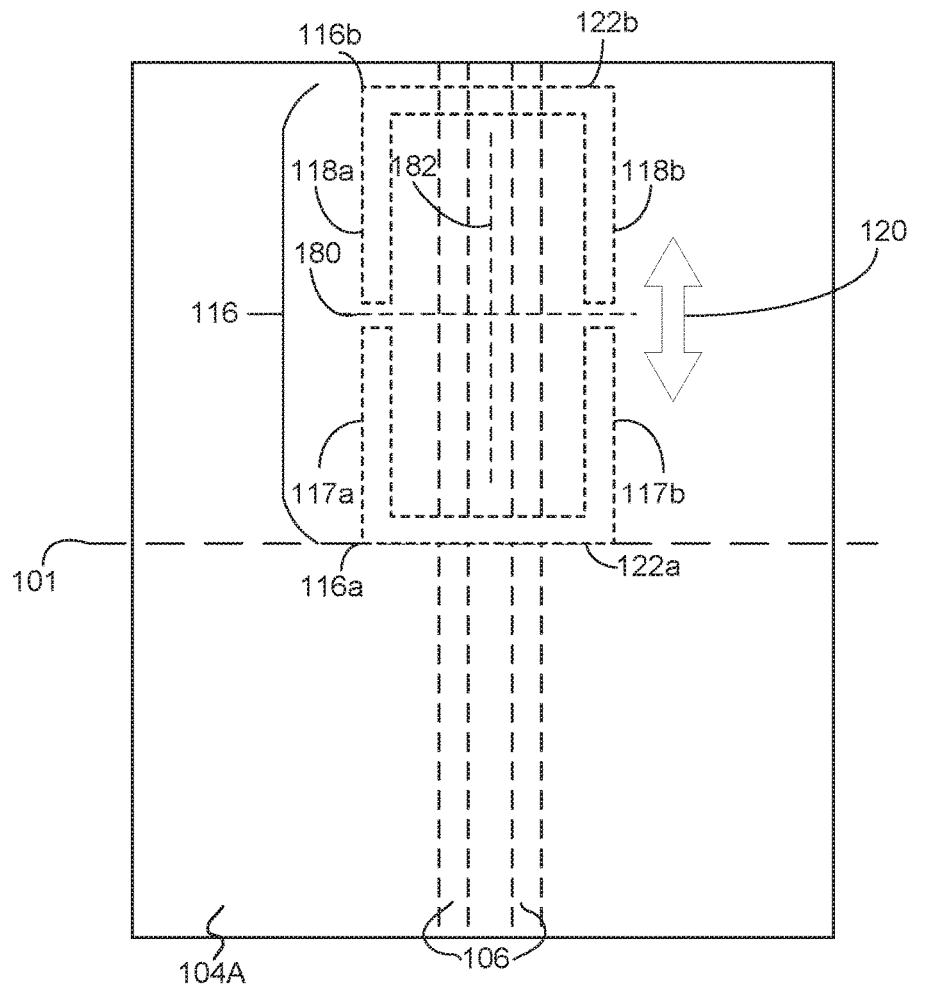
FIGS. 1A and 1B are diagrams of a top view and a cross-sectional front view, respectively, of an example circuit board having a Common Mode Noise Filter (CMNF) to minimize radiation of electromagnetic interference (EMI).

As noted in the background, signal lines are used on or within a circuit board to conductively connect electrical components affixed to the circuit board so that an electronic device including the circuit board can provide a desired functionality. Particularly for high-frequency communication over signal lines, differential signaling can be employed. Differential signaling transmits information using two complementary signals over a pair of differential signal lines. Information is transmitted as the electrical difference between the two signals, as opposed to the difference between a signal on a single signal line and ground, as is done with single-ended signaling. Unlike single-ended signaling, differential signaling is more resistant to common mode noise, or electromagnetic interface (EMI), which commonly affects both signals. Each trace of a differential signal line radiates in a substantially equal and opposite pattern. Where each trace is sufficiently proximal, the radiation emitted by each trace largely cancels.

However, differential signal lines may still propagate the EMI; indeed, unless properly shielded, differential signal lines carrying common mode noise may act as a highly efficient radiator, such as an antenna, of such EMI. Such radiated EMI can affect other parts of an electronic device, even if the differential signaling achieved over the signal lines themselves is resistant to this EMI. Numerous techniques have been employed to shield other parts of an electronic device from such EMI conveyed by differential signal lines. For example, fabricating the differential signal lines as strip-lines within an inner signaling layer of a circuit board, as opposed to as a microstrip on an exterior layer of the board, can contain the EMI within the board itself, suppressing the radiation of the EMI.

However, an inner signaling layer is still at places conductively exposed at locations at the exterior layer of a circuit board, to communicatively connect discrete electrical components attached to the circuit board at the exterior layer to the differential signal lines. For example, plated vias may extend from the exterior layer to the inner signaling layer to permit bypass capacitors, integrated circuits (ICs), and other components to conductively connect to the signaling layer. Such plated vias and other elements themselves are effectively antennas that radiate outwards from the circuit board the EMI propagated along the signaling layer within the circuit board. Even ground vias that extend from the exterior layer to an inner ground plane or layer of the circuit board can become effective antennas that radiate the EMI contained within the circuit board at the signaling layer. The EMI propagating up to the exterior layer thereafter would radiate from the exterior layer.

Existing solutions to contain the EMI within the signaling layer of a circuit board so as not to permit the EMI to radiate outwards from such elements like plated vias and ground vias have decided shortcomings. Mechanical shielding that includes placing metal covers over the elements that act as radiating antennas reduces air flow and thus impinges the ability of an electronic device to operate without overheating. Including absorbing materials within an electronic device, akin to providing an anechoic chamber for the electronic device, similarly can affect the ability to operate the electronic device coolly and increases cost of production.

Disclosed herein, by comparison, are techniques to contain EMI within a circuit board at the signaling layer without incurring these shortcomings. A dual slot Common Mode Noise Filter (CMNF), which is also referred to herein as a dual slot common mode choke, may be fabricated, e.g. etched, within the ground layer of the circuit board. The CMNF may suppress EMI propagation by strip-lines along and within the signaling layer at a wide range of frequencies. The CMNF, unlike prior solutions, may be of a particular size, shape, and configuration such to suppress the EMI propagation at a wide range of frequencies substantially irrespective of the distance the CMNF is placed in relation to a via or other EMI-radiating antenna element. The CMNF minimizes the EMI that the element radiates outwards at the external layer of the circuit board such that the EMI is effectively contained within the signaling layer of the circuit board.

Figure 1B:
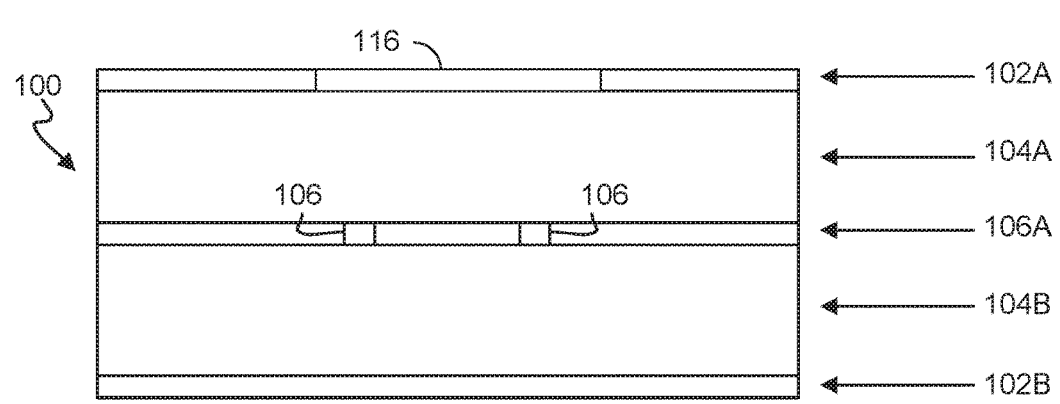

FIGS. 1A and 1B show a top view and a cross-sectional front view, respectively, of an example multiple-layer circuit board 100, such as a printed circuit board. The cross-sectional front view of FIG. 1B is at the cross-sectional line 101 of FIG. 1A. The circuit board 100 can include signaling layer 106, as well as conductive layers 102A and 102B and dielectric layers 104A and 104B. The layers are interleaved with one another as illustrated in example FIG. 1B, and, in an example implementation, may each be comprised of copper and/or the composite material FR-4. There may be more or fewer of the layers 102,104 and/or 106 than are depicted in the example of FIG. 1B. Furthermore, in some example implementations, signal layer 106A may be a top or bottom layer.

Layer 106A may be a prepreg layer, which is a fiber weave layer impregnated with a resin bonding agent. The layers 102A and 102B may be conductive layers, including a top exterior layer 104A, and a bottom exterior layer 104B. Conductive traces, such as copper traces, are formed on signaling layer 106.

As illustrated in FIG. 1B, a pair of differential signal lines 106 is located within signaling layer 106A. Signal lines 106 are depicted in FIG. 1B as routed on a single layer, however in other example implementations signal lines 106 may partially extend through the circuit board 100 or extend completely through the board 100. Connection vias (not shown), which may be plated, may extend from the signal lines 106 within the layer 106 through the top exterior layer 102A to landing pads (not shown) to which an external electrical component, such as a decoupling capacitor or an IC like an application-specific IC (ASIC), can be connected.

CMNF 116 may be a void defined within conductive layer 102A at which there is no conductive material. The CMNF 116, in other words, may be an etched configuration within the conductive material of conductive layer 102A. In the example of FIG. 1A, CMNF 116 has a first U-shaped etching 116a and a second U-shaped etching 116b opposing the first U-shaped etching. In this illustrated example, each of the two U-shaped etchings includes two edges 117a and 117b, and 118a and 118b respectively, opposite and, in this example, parallel to one another, and joined at corresponding ends via a third edge, 122a and 122b respectively. The edges 117a and 117b, and 118a and 118b respectively, are depicted in illustrated example FIG. 1A as being equal in length, and, in this example, longer than the length of the third edge 122. Arrows 120 illustrate that CMNF 116 may be etched into ground plate 114 anywhere along differential signal lines 106. Arrows 120 illustrate that the placement of CMNF 116, unlike other filters, is not dependent upon the placement of vias, e.g. the connection vias or ground vias described above.

In operation, the differential signal lines 106 propagate EMI along signaling layer 106A, even if the differential signal transmitted by the signal lines 106 is unaffected by such EMI when the EMI is common mode noise. Because differential signal lines 106 are strip-lines (i.e., layer 106A is not the exterior layer of circuit board 100, and lines 106 are not formed on the top of exterior layer 102A or on the bottom of the exterior layer 102B in this example), the EMI is largely contained within the circuit board 100. However, because vias (not shown), which more generally referred to as elements, may extend inwards into the circuit board 100 from exterior layer 102A and/or 102B, the EMI can radiate outwards from the board 100 at these elements. That is, the elements may radiate the EMI propagated by the signal lines 106 (i.e., the strip-lines) along the signaling layer 106A outwards from the circuit board 100 at the exterior layer 102A and/or 102.

CMNF 116, within ground plane 102A, however, has a particular size, shape, and configuration to suppress the EMI propagated by signal lines 106 to minimize the EMI that these elements radiate outwards as antennas. The CMNF may block radiation over a wide range of frequencies, as is described in greater detail below. The U-shaped pair of CMNF 116 is relatively easy to etch, and complex shapes that can be difficult to fabricate may be unnecessary, as compared to defected ground structures used to improve common mode noise resistance of differential signal lines themselves. Furthermore, CMNF is not limited to a placement adjacent to a via of circuit board 100.

CMNF 116 may be of a symmetrical or asymmetrical configuration. First U-shaped etching 116a and second U-shaped etching 116b, may, in some example implementations, be symmetrical about a Y-axis 180 perpendicular to differential signal lines 106. In other example implementations, first U-shaped etching 116a and second U-shaped etching 116b, may be symmetrical about an X-axis 182 centered between differential signal lines 106. However, in other example implementations as will be described in further detail below, first U-shaped etching 116a and second U-shaped etching 116b may be of a configuration that is asymmetrical about Y-axis 180.

Figure 2A:
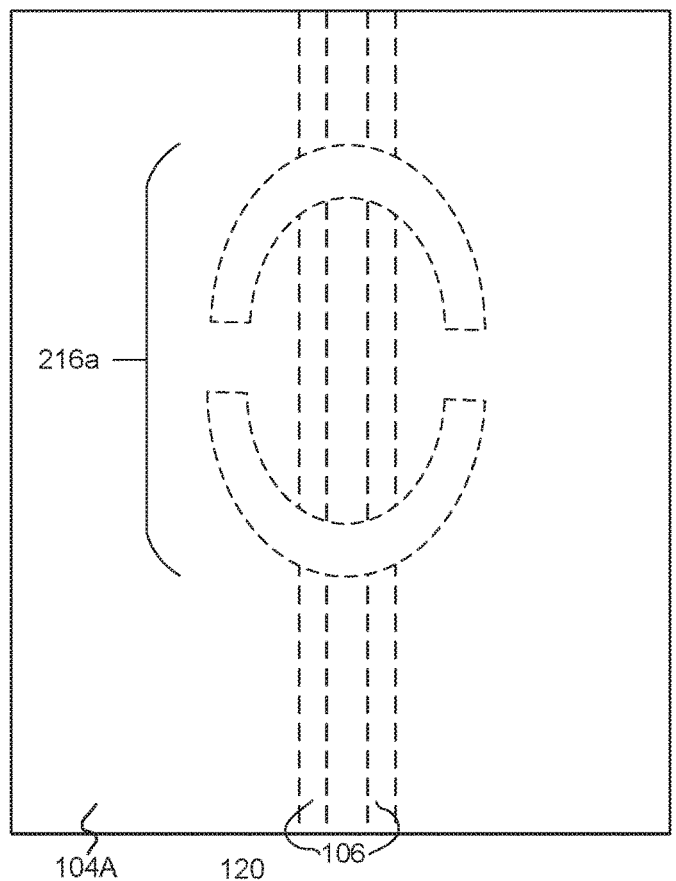
FIGS. 2A and 2B are diagrams of a top view of additional example circuit boards having a Common Mode Noise Filter (CMNF) to minimize EMI.
Figure 2B:
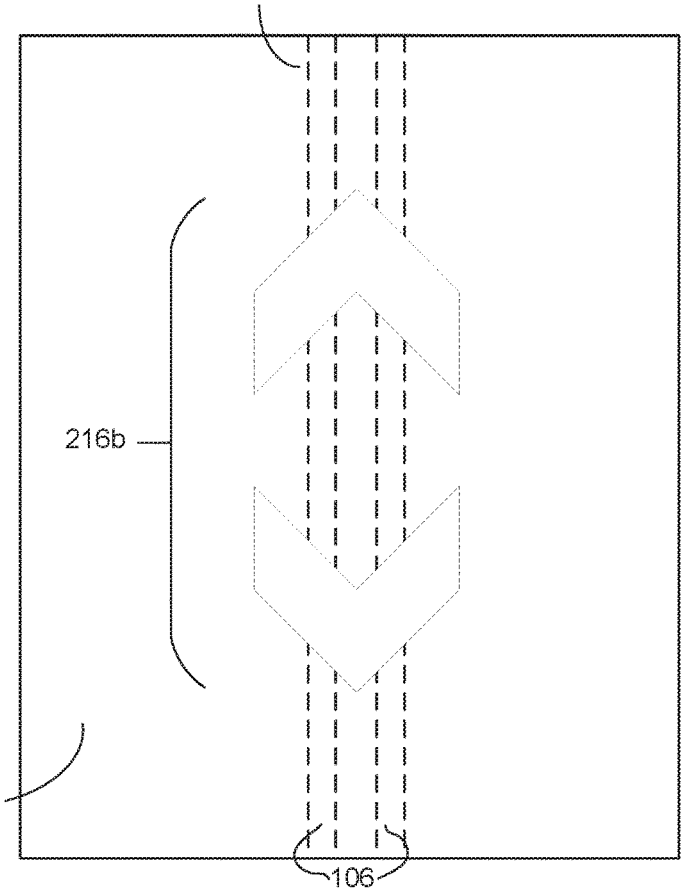

The U-shaped pair of CMNF 116 is illustrated at FIG. 1 as opposing square-shaped brackets in which each of the U-shaped pairs, two edges, 117a and 117b, and 118a and 118b respectively, are substantially straight and parallel. However, the U-shaped pair may not be so limited. FIG. 2A and FIG. 2B are diagrams of a top view of an example circuit board, 200A and 200B respectively, having a CMNF to minimize EMI. FIG. 2A and FIG. 2B may include similar components to that of FIG. 1, including differential signal lines 106. FIG. 2A and FIG. 2B further depict two additional examples of U-shaped pairs at 216a and 216b respectively. While only two such examples of U-shaped pairs at FIGS. 2A and 2B are depicted, any number of other U-shaped pairs may be implemented.

Figure 3:
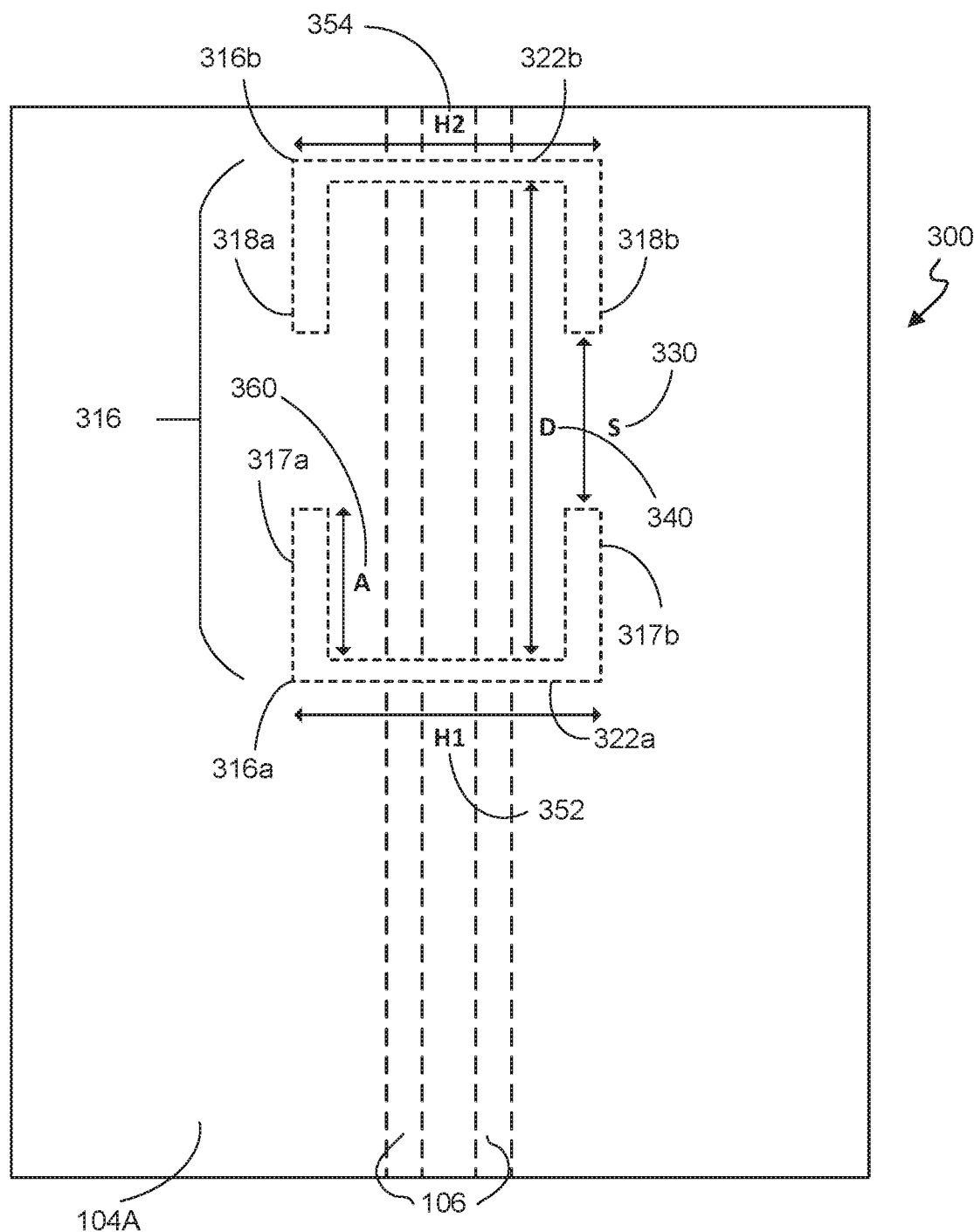
FIG. 3 is a diagram of a top view of an example circuit board having a loosely coupled Common Mode Noise Filter (CMNF) to minimize EMI.

FIG. 3 is a diagram of a top view of an example circuit board having a CMNF to minimize EMI. FIG. 3 may include similar components to that of FIG. 1, including differential signal lines 106. Example CMNF 316, like CMNF 116 of FIG. 1A, may be a void defined within conductive layer 102A at which there is no conductive material. In another example implementation, CMNF 316 may be defined within conductive layer 102B. Example CMNF 316 has a first U-shaped etching 316a and a second U-shaped etching 316b opposing the first U-shaped etching. In this illustrated example, each of the two U-shaped etchings includes two edges 317a and 317b, and 318a and 318b respectively, opposite and, in this example, parallel to one another, and joined at corresponding ends via a third edge, 322a and 322b respectively. Each of the two U-shaped etchings may be separated by a spacing 330 and a distance 340. First U-shaped etching may include an edge length A 360 and a height H1 352.

In this example implementation, first U-shaped etching 316a and second U-shaped etching 316b may be loosely coupled. In an example, the U-shaped etching pair, 316a and 316b respectively, is loosely coupled where a ratio of spacing S 330 between first U-shaped etching 316a and second U-shaped etching 316b over height H1 of first U-shaped etching 316a or height H2 of second U-shaped etching 316b is greater than 0.25. In other words, where the spacing S 330 between first U-shaped etching 316a and second U-shaped etching 316b is at least four times greater than either height H1 of first U-shaped etching 316a or H2 of second U-shaped etching 316b.

In another example, the U-shaped etching pair, 316a and 316b respectively, is loosely coupled where a ratio of spacing S 330 between first U-shaped etching 316a and second U-shaped etching 316b over edge length A1 of first U-shaped etching 316a or edge length A2 of second U-shaped etching is greater than 0.20. In other words, where the spacing S 330 between first U-shaped etching 316a and second U-shaped etching 316b is at least five times greater than either edge length A1 of first U-shaped etching 316a or edge length A2 of second U-shaped etching.

Figure 4A:
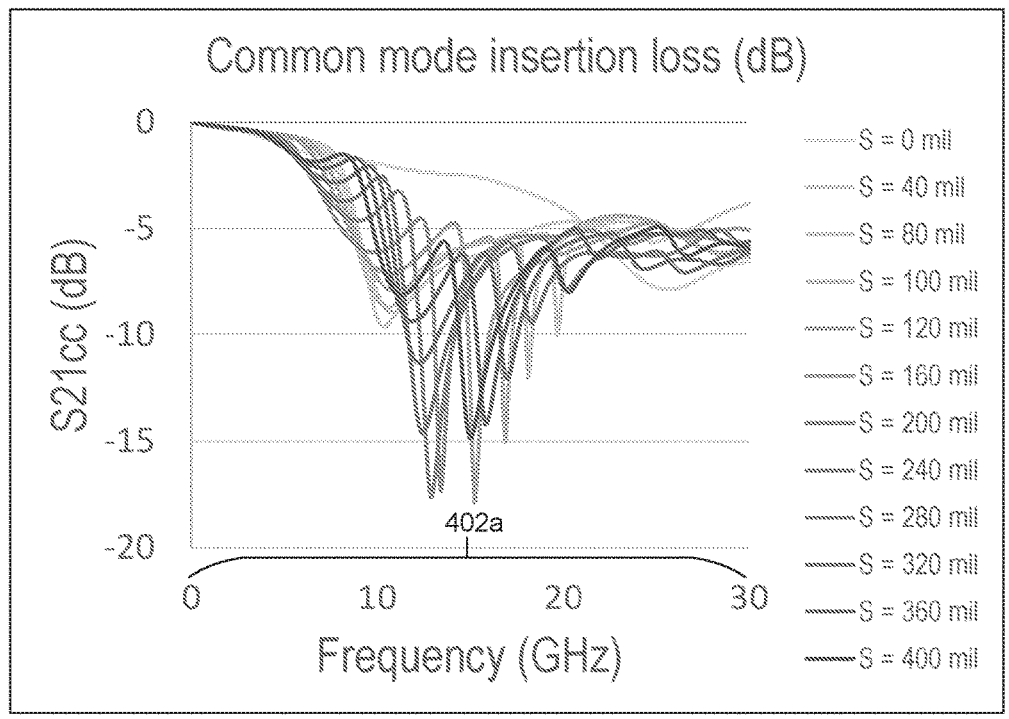
FIGS. 4A and 4B are line graphs illustrating frequency dependent common mode suppression at varying Common Mode Noise Filter spacings and heights.
Figure 4B:
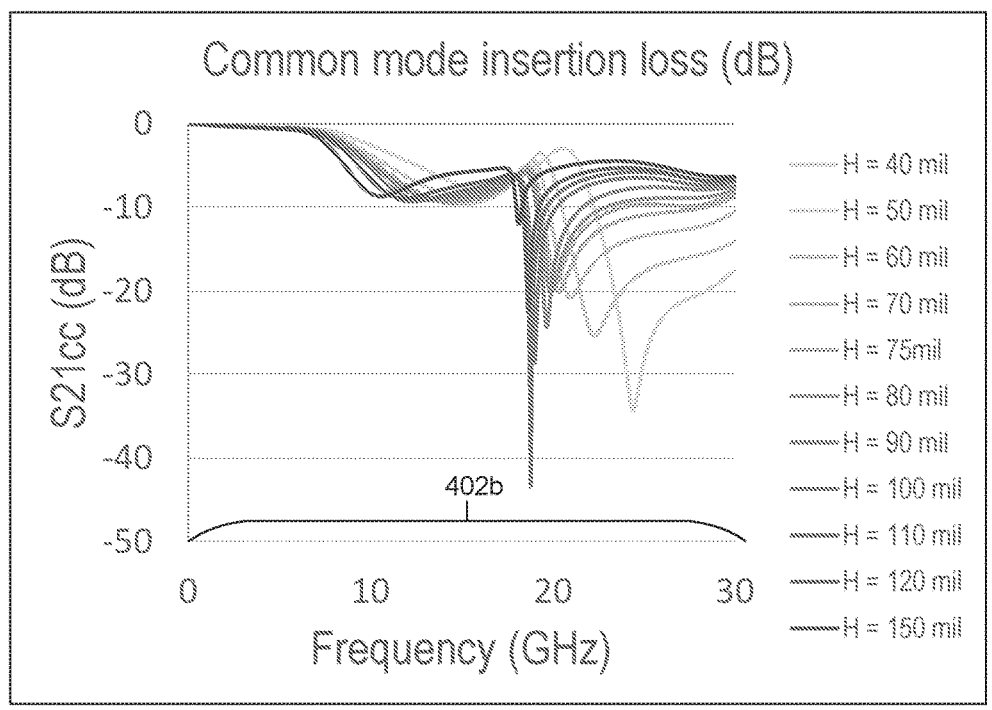

A loose coupling of the U-shaped etching pair 316a and 316b respectively, provides numerous benefits. For example, loosely coupling the U-shaped etching pair provides for excellent control over the tuned frequency of the filter as well as the bandwidth of the filter. FIG. 4A and FIG. 4B are line graphs, 400a and 400b respectively, illustrating experimental results for U-shaped etching pairs of varying spacing S 330 with other variables held constant, and for varying height H1 and H2 with other variables held constant. As illustrated in FIGS. 4A and 4B, EMI radiation (illustrated in decibels) is effectively suppressed over a wide frequency bandwidth, 402a and 402b respectively. In this example, common mode noise frequency is illustrated on the x-axis and $s_{21}^{cc}$ is illustrated on the y-axis, where $s_{21}^{cc}$, is the common mode transmission coefficient of a mixed-mode scattering parameter matrix. In this example, the magnitude in decibels of $s_{21}^{cc}$ is a fraction of the incident common mode power.

At FIG. 4A, noticeable common mode frequency suppression occurs between approximately 5 GHz and over 30 GHz, and dramatic suppression occurs between approximately 10-20 GHz. The magnitude of suppression with respect to frequency varies by spacing S 330 (as shown in FIG. 3), with results of varying spacing illustrated between 0 and 400 millimeters. As illustrated by the results, suppression tends to increase with increased spacing S 330 relative to a fixed height H1 352 or H2 354. For these example experimental results, the dimensions of the first U-shaped etching 316a and second U-shaped etching 316b were held constant, where H1 352 and H2 354 of first U-shaped etching 316a and second U-shaped etching 316b was held at 75 millimeters, and an edge length A of first U-shaped etching 316a and second U-shaped etching 316b was held at 40 millimeters.

Turning to FIG. 4B, EMI radiation (illustrated in decibels) is effectively suppressed over a wide frequency bandwidth, with noticeable suppression occurring between approximately 5 GHz and over 30 GHz, and dramatic suppression occurring at a tuned frequency that varies with height H. As illustrated, an increase in height H1 352 and H2 354 results in a lower choked frequency. For these example simulated results, dimensions other than height H1 352 and H2 354 were held constant, as well as spacing S 330. In these illustrated example results, edge length A 360 of first U-shaped etching 316a was held at 40 millimeters, and spacing S 330 was held at 100 millimeters.

Figure 5:
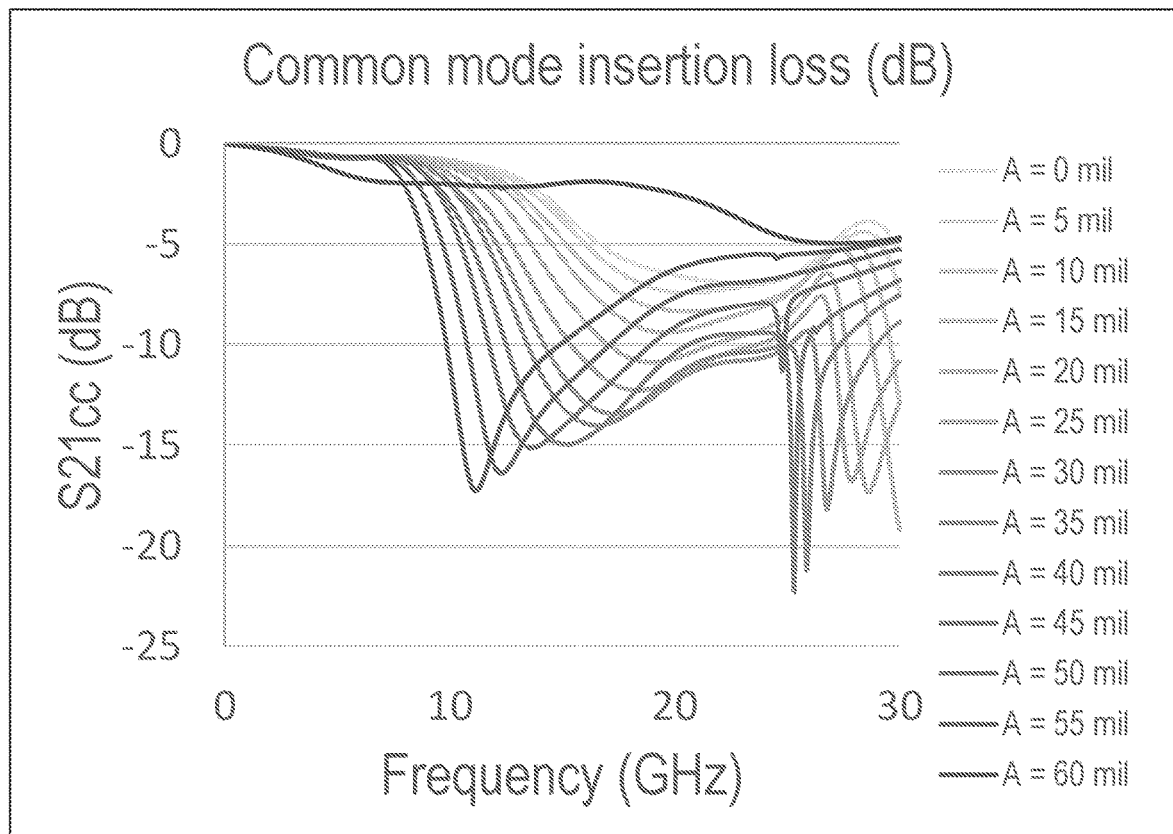
FIG. 5 is a line graph illustrating frequency dependent common mode suppression at varying Common Mode Noise Filter edge lengths.

As described above, a loosely coupled U-shaped pair may be defined by the relative edge length of the first or second U-shaped etching relative to the spacing between the first and second U-shaped etching. FIG. 5 is a line graph 500, illustrating experimental results for U-shaped etching pairs of varying edge length A 360 with other variables held constant. EMI radiation (illustrated in decibels) is effectively suppressed over a wide frequency bandwidth, with a first choked frequency that varies by edge length A 360 between ~10-20 GHz and a second choked frequency that varies by edge length A 360 between ~25-30 GHz. In these illustrated example results, height H1 352 and height H2 354 of first U-shaped etching 316a and second U-shaped etching 316b respectively, was held at 70 millimeters, and distance D 340 between first U-shaped etching 316a and second U-shaped etching 316b was held at 100 millimeters. As illustrated by the example results of FIGS. 4A and 4B and FIG. 5, the loose coupling of the U-shaped etching pair 316 provides for excellent control over the tuned suppression frequency as well as the filter bandwidth.

Figure 6:
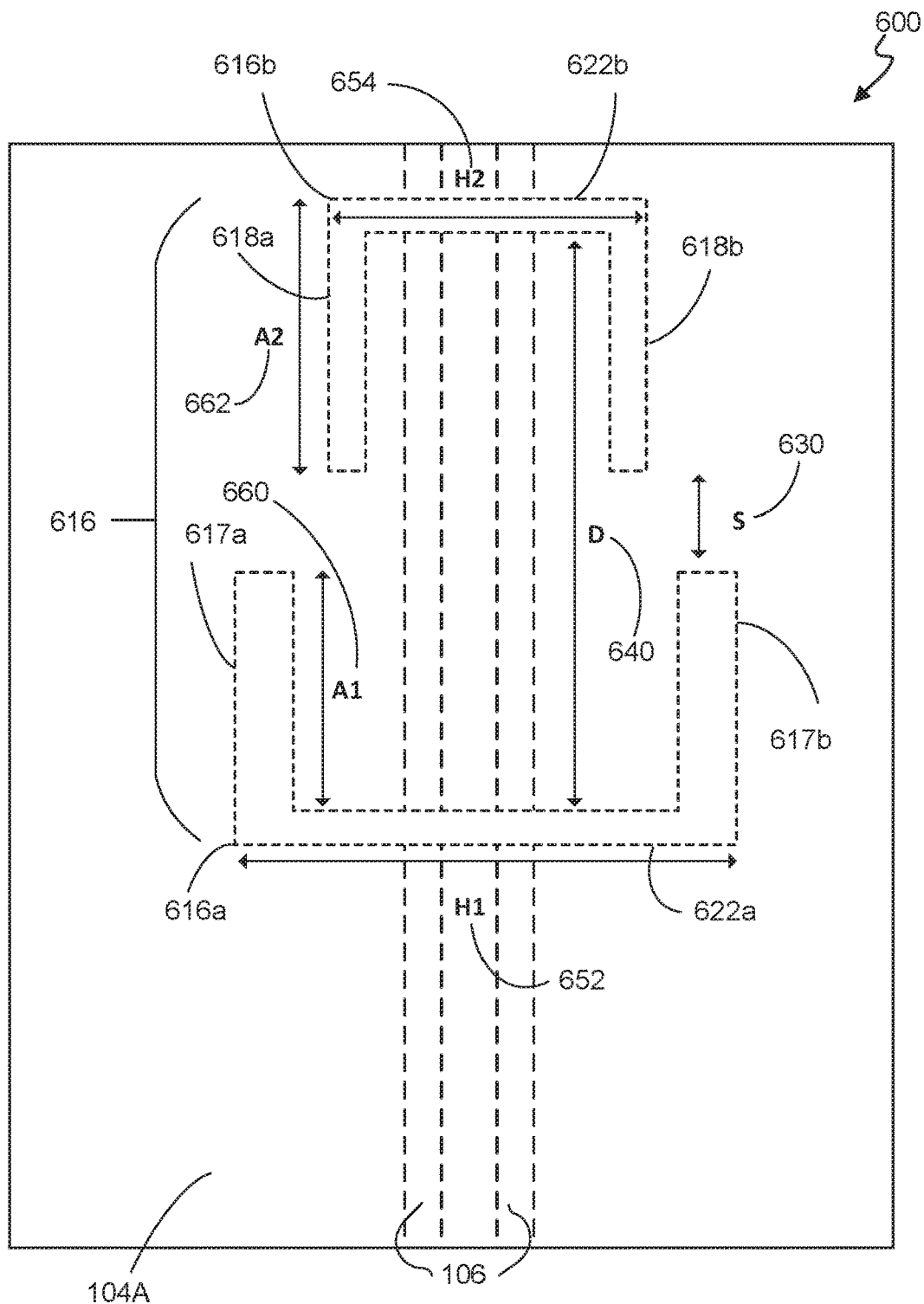
FIG. 6 is a diagram of a top view of an example circuit board having an asymmetrical Common Mode Noise Filter (CMNF) to minimize EMI.

FIG. 6 is a diagram of a top view of another example circuit board 600 having a Common Mode Noise Filter (CMNF) to minimize EMI. FIG. 6 may include similar components to that of FIG. 1, including differential signal lines 106. FIG. 6 illustrates an example CMNF 616 having an asymmetrical U-shaped pairing. CMNF 616 has a first U-shaped etching 616a and a second U-shaped etching 616b opposing the first U-shaped etching. In this illustrated example, each of the two U-shaped etchings includes two edges 617a and 617b, and 618a and 618b respectively, opposite and, in this example, parallel to one another, and joined at corresponding ends via a third edge, 622a and 622b respectively. Edges 117a and 117b, and 118a and 118b respectively, are depicted in illustrated example FIG. 6 as having different respective edge lengths, A1 660 and A1 662 respectively. First U-shaped etching 616a and second U-shaped etching 616b is further illustrated as having different heights, H1 652 and H2 654 respectively.

Figure 7A:
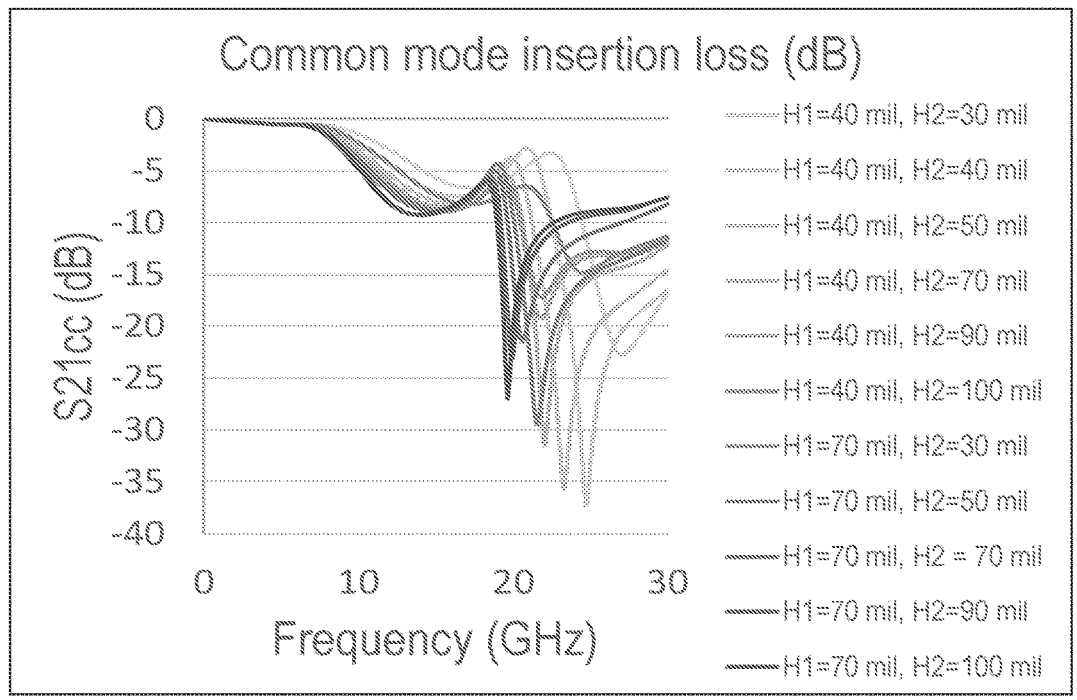
FIGS. 7A and 7B are line graphs illustrating frequency dependent common mode suppression at varying Common Mode Noise Filter heights and edge lengths.
Figure 7B:
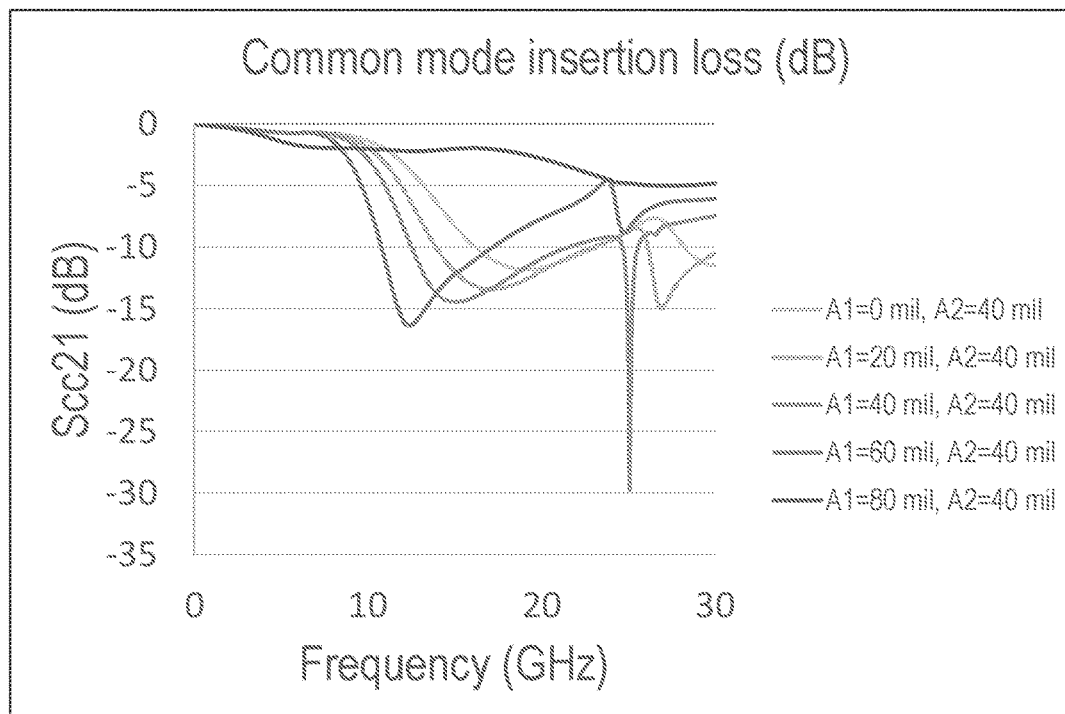

FIGS. 7A and 7B are line graphs, 700A and 700B respectively, illustrating experimental results for asymmetrical U-shaped etching pairs, e.g. asymmetric U-shaped etching pair 616 illustrated in FIG. 6. As is apparent from the illustrated experimental results, U-shaped etching pairs of varying asymmetry may result in different levels of tuning and frequency dependent common mode suppression. FIG. 7A shows varying frequency relative EMI radiation levels (illustrated in decibels) with a varying height H1 of first U-shaped etching pair 616a of FIG. 6, and varying height H2 of second U-shaped etching pair 616b of FIG. 6. FIG. 7B shows varying frequency dependent common mode noise levels (illustrated in decibels) with a varying edge length A1 of first U-shaped etching pair 617a of FIG. 6, and varying edge length A2 of second U-shaped etching pair 618a of FIG. 6.

As illustrated in FIGS. 7A and 7B, EMI radiation levels are suppressed over a wide frequency bandwidth. Specifically, as illustrated in FIG. 7A, a first resultant choked frequency varies by a height differential within a range of approximately 5-15 GHz, and a second, more pronounced choked frequency that varies by the height differential within a range of approximately 20-30 GHz. In the illustrated example results of FIG. 7A, edge lengths A1 and A2 are held constant at 40 millimeters, as well as distance D 340 between first U-shaped etching pair 617a and second U-shaped etching pair 618a at 180 millimeters.

As illustrated in FIG. 7B, a first resultant choked frequency varies by an edge length differential within a range of approximately 10-20 GHz, and a second, more pronounced choked frequency varies by the edge length differential within a range of approximately 25-30 GHz. In the illustrated example results of FIG. 7A, height H1 and H2 are held constant at 70 millimeters, as well as the distance D 340 between first U-shaped etching pair 617a and second U-shaped etching pair 618a at 120 millimeters. Accordingly, the dimensions, spacing, and configuration of the U-shaped etching pair may be tuned to a particular choke frequency range.

Figure 8A:
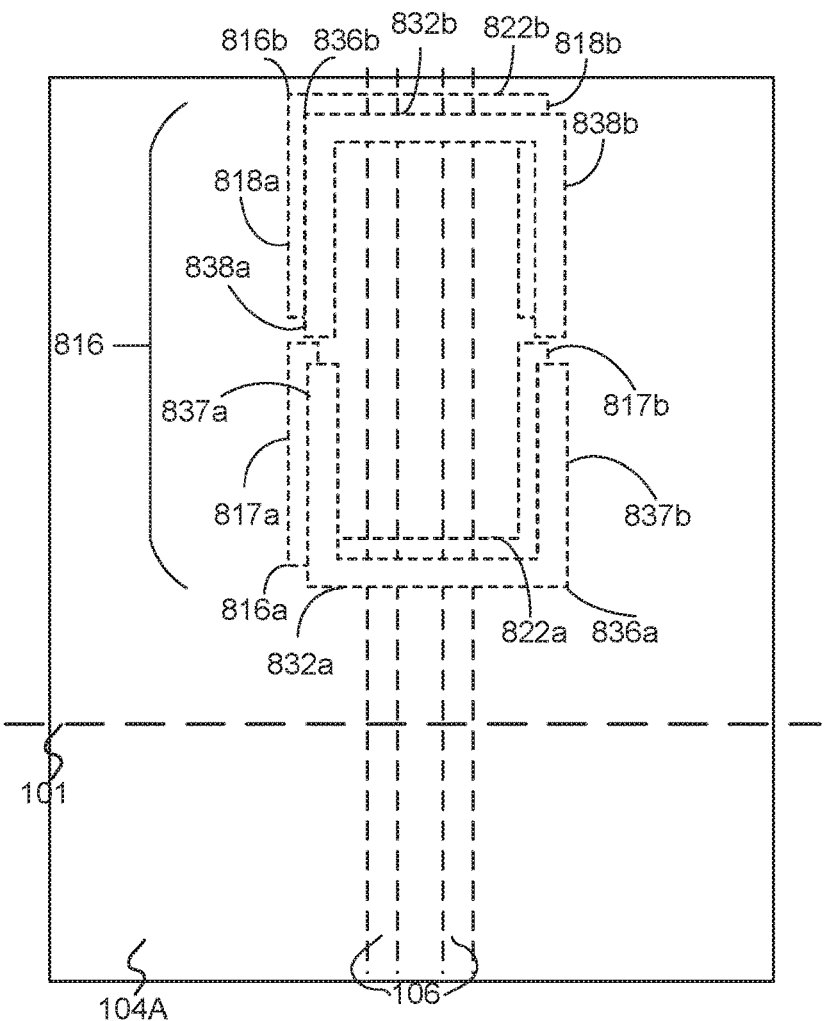
FIGS. 8A and 8B are diagrams of a top view and a cross-sectional front view, respectively, of an example circuit board having a Common Mode Noise Filter (CMNF) to minimize radiation of electromagnetic interference (EMI).

FIG. 8A specifically illustrates another example circuit board 800 having a Common Mode Noise Filter (CMNF) 816 to minimize EMI. FIG. 8A and FIG. 2B may include similar components to that of FIG. 1, including differential signal lines 106 as well as example conducive layers 102A and 102B, example dielectric layers 104A and 104B, and example signaling layer 106A.

CMNF 816 may be a void defined within conductive layer 102A and conductive layer 102B at which there is no conductive material. CMNF 816, may be an etched configuration within the conductive material, and, in this example implementation, may include two pairs of cuts, one through conductive layer 102A and one through conductive layer 102B. For example, CMNF may include a first U-shaped etching pair above differential signal lines 106 and a second U-shaped etching pair below differential signal lines 106. In the example of FIG. 8, CMNF 816 has a first U-shaped etching pair including a first U-shaped etching 836a and a second U-shaped etching 836b opposing the first U-shaped etching. In this illustrated example, each of the two U-shaped etchings includes two edges 837a and 837b, and 838a and 838b respectively, opposite and, in this example, parallel to one another, and joined at corresponding ends via a third edge, 832a and 822b respectively. The edges 837a and 837b, and 838a and 838b respectively, are depicted in illustrated example FIG. 8A as being equal in length; however, as is apparent from other examples described herein, the edges need not be equal in length.

CMNF 816 further has a second U-shaped etching pair including a first U-shaped etching 816a and a second U-shaped etching 816b opposing the first U-shaped etching. In this illustrated example, each of the two U-shaped etchings includes two edges 817a and 817b, and 818a and 818b respectively, opposite and, in this example, parallel to one another, and joined at corresponding ends via a third edge, 832a and 832b respectively. The edges 817a and 817b, and 818a and 818b respectively, are depicted in illustrated example FIG. 8A as being equal in length; however, as is apparent from other examples described herein, the edges need not be equal in length.

Figure 8B:
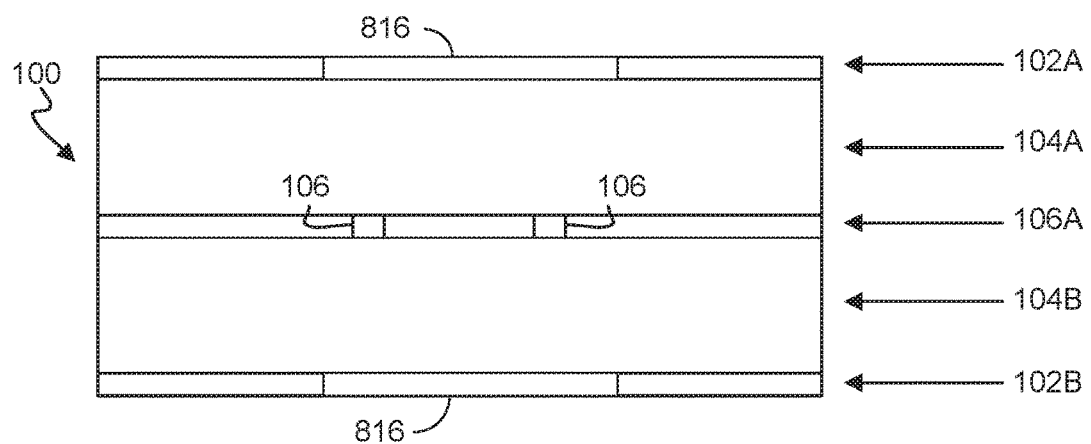

The circuit board 800 is depicted in FIG. 8B as including CMNF 816 in conductive layers 102A and 102B. In this example implementation, conductive layer 102B is located adjacently below the layer at which the signal lines 106 end within the circuit board 100 and conductive layer 102A is located adjacently above the layer at which the signal lines 106 end within the board 100. Each such ground plane can have the same defected ground structure. Such an implementation can result in improved EMI suppression.

Figure 9:
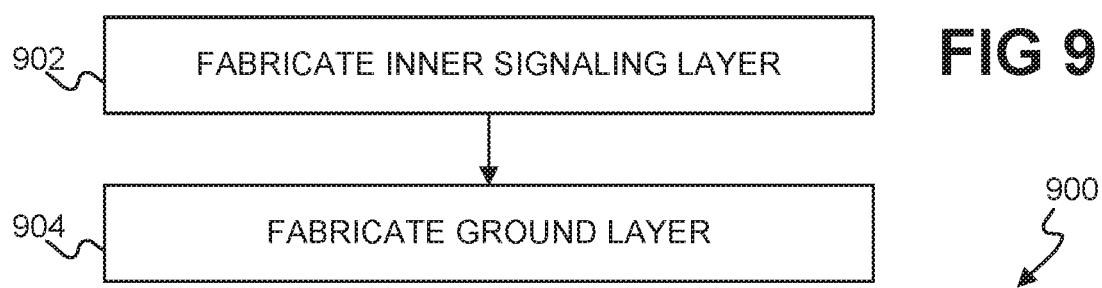
FIG. 9 is a flowchart illustrating an example method for circuit board fabrication.

FIG. 9 is a flowchart illustrating a method for circuit board fabrication. Although execution of method 900 is described below with reference to system 100, this is for explanatory purposes and other suitable components for execution of method 900 may be utilized. Additionally, the components for executing method 900 may spread among multiple devices. Method 900 may be implemented in the form of executable instructions stored on a machine-readable storage medium and/or in the form of electronic circuitry, e.g. hardware. In some examples, steps of method 900 may be executed substantially concurrently or in a different order than shown in FIG. 9. In some examples, method 900 may include more or less steps than are shown in FIG. 9. In some examples, some of the steps of method 900 may, at certain times, be ongoing and/or may repeat.

FIG. 9 shows an example method 900 including constituent circuit board fabrication steps, parts, or acts. Fabrication of a circuit board 100 includes fabricating an inner signaling layer, such as the layer 102A, so that it includes a pair of differential signal lines 106 that convey EMI along the layer (902). Inner signaling layer may substantially flat, such that the inner signaling layer lies in an XY-plane.

Fabrication further includes fabricating a ground layer, such as the ground plane 114, that includes etching a CMNF 116 into the ground layer (904). The CMNF etching 116 may be of a particular size, shape, and configuration to contain the EMI within circuit board 100, and may specifically include a U-shaped etching pair including, for example, first U-shaped etching 116a and second U-shaped etching 116b opposing first U-shaped etching 116a.

In an example implementation, etching the CMNF may include etching a second U-shaped etching pair within the ground plane, including a third U-shaped etching and a fourth U-shaped etching. Turning to example FIG. 8, a first U-shaped etching pair, 836a and 836b respectively, and a second U-shaped etching pair, 816a and 816b respectively, is illustrated. The etching may be such that first U-shaped etching pair, 836a and 836b respectively, is positioned above differential signal line pair 106, and second U-shaped etching pair, 816a and 816b respectively, is positioned below differential signal line pair 106. In an example implementation, the first U-shaped etching pair and the second U-shaped etching pair may be positioned symmetrically about an XY-plane formed by inner signaling layer, e.g. layer 102, as illustrated in FIG. 8.

Figure 10:
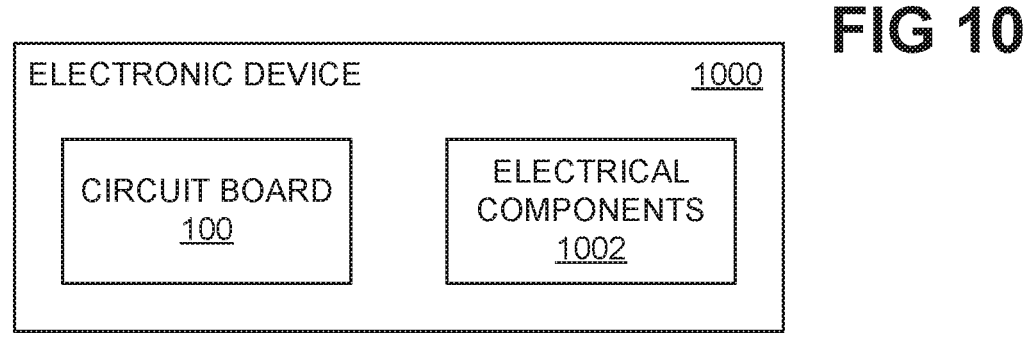
FIG. 10 is a diagram of an example apparatus, such as an electronic device, which includes a circuit board having a defected ground structure to reduce or minimize EMI radiation or emission from the circuit board.

FIG. 10 shows an example electronic device 1000, which is more generally an apparatus. The electronic device 1000 includes the circuit board 100 that has been described, including Common Mode Noise Filter (CMNF) 116, for instance, to reduce if not eliminate EMI emissions at a selected resonant frequency. The electronic device 1000 may further include electrical components 1002 that are mounted or attached to the circuit board 100. Examples of such components 1002 include capacitors such as decoupling capacitors, ICs such as ASICs, as well as other types of electrical components.

The techniques disclosed herein thus minimize radiation of EMI at a selected resonant frequency, e.g., from vias and other effective antennas that otherwise emit EMI which propagates along differential strip-lines within a circuit board. These techniques include configuring a CMNF of a particular size and/or shape to suppress EMI at the strip-lines irrespective of proximity of the CMNF to effective antennas.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

We claim:

1. An apparatus comprising:
   a multiple-layer circuit board having a signaling layer plane, an exterior layer plane, and a ground layer plane;
   a pair of differential signal lines implemented as strip-lines within the signaling layer, which propagate electromagnetic interference (EMI) along the signaling layer; and
   a dual slot common-mode noise filter etched into the ground layer, the dual slot common-mode noise filter including a first U-shaped etching pair comprising a first U-shaped etching and a second U-shaped etching opposing the first U-shaped etching within the ground layer plane, wherein the first U-shaped etching pair is positioned above the pair of differential signal lines.

2. The apparatus of claim 1, wherein dimensions of the first U-shaped etching differ from those of the second U-shaped etching, including at least one of a different height H and a different arm length A.

3. The apparatus of claim 1, wherein the dual slot common mode noise filter further includes a second U-shaped etching pair comprising a third U-shaped etching and a fourth U-shaped etching opposing the third U-shaped etching, the second U-shaped etching pair positioned below the differential signal lines.

4. The apparatus of claim 3, wherein the second U-shaped etching pair is symmetrical to the first U-shaped etching pair about an XY plane formed by the inner signaling layer.

5. The apparatus of claim 1, wherein the first U-shaped etching and the second U-shaped etching are loosely coupled.

6. The apparatus of claim 5, wherein the first U-shaped etching and the second U-shaped etching are loosely coupled such that a spacing S between the first U-shaped etching and the second U-shaped etching is greater than a fifth of a height H of the first U-shaped etching.

7. The apparatus of claim 5, wherein the first U-shaped etching and the second U-shaped etching are loosely coupled such that a spacing S between the first U-shaped etching and the second U-shaped etching is greater than a distance D between the differential signal lines.

8. The apparatus of claim 1, wherein the first U-shaped etching is symmetrical to the second U-shaped etching about a Y-axis perpendicular to the differential signal lines.

9. A circuit board comprising:
a signaling layer including a pair of parallel strip-lines that propagate electromagnetic interference (EMI);
a dual slot common-mode noise filter etched into the ground layer, the dual slot common-mode noise filter including a first bracket etching pair comprising a first bracket etching comprising a first edge and a second edge parallel to one another, and a third edge perpendicular to the first edge and the second edge and connecting corresponding ends of the first edge and the second edge, and a second bracket etching opposing the first bracket etching about a Y-axis perpendicular to the pair of strip-lines, wherein the first bracket etching pair is positioned above the pair of differential signal lines.

10. The circuit board of claim 9, wherein the first edge and second edge are of equal length.

11. The circuit board of claim 9, wherein the first bracket etching and second bracket etching are positioned such that the first bracket etching is symmetrical about an X-axis centered between the pair of strip-lines and the second bracket etching is symmetrical about an X-axis centered between the pair of strip-lines.

12. The circuit board of claim 9, wherein the third edge is of a greater length than the first edge and second edge.

13. The circuit board of claim 9, wherein the dual slot common-mode noise filter further includes a second bracket etching pair comprising a third bracket etching and a fourth bracket etching opposing the third bracket etching, the second bracket etching pair positioned below the differential signal lines.

14. The circuit board of claim 13, wherein the second bracket etching pair is symmetrical to the first bracket etching pair about an XY plane formed by the inner signaling layer.

15. The circuit board of claim 9, wherein the first bracket etching pair and the second bracket etching pair are loosely coupled.

16. The circuit board of claim 15, wherein the first bracket etching and the second bracket etching are loosely coupled such that a spacing S between the first bracket etching and the second bracket etching is greater than a fifth of a height H of the first bracket etching.

17. A method comprising:
fabricating an inner signaling layer of the circuit board to include a pair of differential signal lines that convey electromagnetic interference (EMI) along the inner signaling layer; and
fabricating a ground layer of a multiple-layer circuit board, including etching a dual slot common-mode noise filter into the ground layer, wherein etching the dual slot common-mode noise filter includes etching, within the ground plane, a first U-shaped etching pair comprising a first U-shaped etching and a second U-shaped etching opposing the first U-shaped etching, wherein the first U-shaped etching pair and the second U-shaped etching pair are positioned symmetrically about an XY-plane formed by the inner signaling layer.

18. The method of claim 17, wherein etching the dual slot common-mode noise filter further includes etching, within the ground plane, a second U-shaped etching pair comprising a third U-shaped etching and a fourth U-shaped etching opposing the third U-shaped etching.

* * * * *